(12) United States Patent
Van Der Pasch et al.

(10) Patent No.: US 7,602,489 B2
(45) Date of Patent: Oct. 13, 2009

(54) LITHOGRAPHIC APPARATUS AND DEVICE MANUFACTURING METHOD

(75) Inventors: Engelbertus Antonius Fransiscus Van Der Pasch, Oirschot (NL); Emiel Jozef Melanie Eussen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 229 days.

(21) Appl. No.: 11/358,725

(22) Filed: Feb. 22, 2006

(65) Prior Publication Data

US 2007/0195296 A1    Aug. 23, 2007

(51) Int. Cl.
    *G01B 11/00* (2006.01)
(52) U.S. Cl. .......................... 356/399; 355/53; 355/72; 355/75
(58) Field of Classification Search .................... 355/53, 355/72, 75; 29/740; 427/304, 305, 306
    See application file for complete search history.

(56) References Cited

U.S. PATENT DOCUMENTS

| 5,610,715 A * | 3/1997 | Yoshii et al. ................. 356/499 |
| 2004/0263846 A1 | 12/2004 | Kwan |
| 2005/0168714 A1 | 8/2005 | Renkens et al. |
| 2006/0023178 A1* | 2/2006 | Loopstra et al. ............... 355/53 |
| 2006/0023194 A1* | 2/2006 | Loopstra et al. ............... 355/72 |
| 2006/0227309 A1* | 10/2006 | Loopstra et al. ............... 355/53 |

FOREIGN PATENT DOCUMENTS

| EP | 1111472 A2 | 6/2001 |
| EP | 1621933 A2 | 2/2006 |
| EP | 1762897 A1 | 3/2007 |
| EP | 1826615 A2 | 8/2007 |

OTHER PUBLICATIONS

Mark L. Schattenburg and Henry I. Smith,"The critical role of metrology in nanotechnology", 2002, Proc. SPIE 4608, 116.*

(Continued)

*Primary Examiner*—Diane I Lee
*Assistant Examiner*—Steven H Whitesell-Gordon
(74) *Attorney, Agent, or Firm*—Pillsbury Winthrop Shaw Pittman LLP

(57) ABSTRACT

A lithographic apparatus includes a displacement measuring system to measure a position of a moveable object with respect to a reference frame of the lithographic apparatus, in at least three coplanar degrees of freedom (x, y, Rz) of an orthogonal x-y-z coordinate system centered in the center of the moveable object. The moveable object includes a support structure configured to support a patterning device or a substrate table configured to support a substrate. The displacement measuring system includes at least three sensor heads, each sensor head being positioned with a measuring direction substantially coplanar with the x-y plane of the coordinate system and each sensor head being furthermore positioned with the measuring direction substantially perpendicular to a connection line connecting the sensor head with the center of the movable object and extending coplanar with the x-y plane.

18 Claims, 4 Drawing Sheets

OTHER PUBLICATIONS

J. Gargas, R. Dorval, D. Mansur, H. Tran, D. Carlson, & M. Hercher. "A Versatile XY Stage with a Flexural Six-Degree-of-Freedom Fine Positioner," Oct. 1995, Proc. of the 10th Annual Mtg. of the ASPE.*

Schäffel et al., "Integrated Electrodynamic Multicoordinate Drives—Modern Components for Intelligent Motions", Proceedings of: The American Society for Precision Engineering—Eleventh Annual Meeting, vol. 14, pp. 456-461 (1996).

Search Report and Written Opinion issued on Sep. 25, 2008 in Singapore Application No. 200701182-8.

* cited by examiner

LITHOGRAPHIC APPARATUS AND DEVICE MANUFACTURING METHOD

BACKGROUND

1. Field of the Invention

The present invention relates to a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

One of the most challenging requirements in micro-lithography for the production of integrated circuits as well as liquid crystal display panels is the positioning of tables. For example, sub-100 nm lithography demands substrate- and mask-positioning stages with dynamic accuracy and matching between machines to the order of 1 nm in all 6 degrees of freedom (DOF), at velocities of up to 3 m/s and higher.

A popular approach to such demanding positioning requirements is to sub-divide the stage positioning architecture into a coarse positioning module (e.g. an X-Y table or a gantry table) with micrometer accuracies but travelling over the entire working range, onto which is cascaded a fine positioning module. The latter is responsible for correcting for the residual error of the coarse positioning module to the last few nanometers, but only needs to accommodate a very limited range of travel. Commonly used actuators for such nano-positioning include piezoelectric actuators or voice-coil type electromagnetic actuators. While positioning in the fine module is usually effected in all 6 DOF, large-range motions are rarely required for more than 2 DOF, thus easing the design of the coarse module considerably.

The micrometer accuracy desired for the coarse positioning can be readily achieved using relatively simple position sensors, such as optical or magnetic incremental encoders. These can be single-axis devices with measurement in one DOF, or more recently multiple (up to 3) DOF devices such as those described by Schäffel et al "Integrated electro-dynamic multicoordinate drives", Proc. ASPE Annual Meeting, California, USA, 1996, p. 456-461. Similar encoders are also available commercially, e.g. position measurement system Type PP281R manufactured by Dr. J. Heidenhain GmbH. Although such sensors can provide sub-micrometer level resolution without difficulty, absolute accuracy and in particular thermal stability over long travel ranges are not readily achievable.

Position measurement for the mask and substrate tables at the end of the fine positioning module, on the other hand, has to be performed in all 6 DOF to sub-nanometer resolution, with nanometer accuracy and stability. This is commonly achieved using multi-axis interferometers to measure displacements in all 6 DOF, with optional redundant axes for additional calibration functions (e.g. calibrations of interferometer mirror flatness on the substrate table).

However, with the above approach, every time the stage is brought (back) into the range of the fine positioning module, the position of the stage has to be (re)calibrated in six degrees of freedom. This may take a considerable amount of time, and as a result the throughput of the lithographic apparatus may be decreased.

As an alternative for interferometers, it is known to use optical encoders, possibly in combination with interferometers. Such optical encoders are for instance disclosed in US 2004/0263846 A1, which document is hereby incorporated herein by reference. The optical encoders described in this application make use of a grid plate that comprises a grid pattern, which is used to determine the position of a sensor with respect to the grid pattern. In an embodiment, the sensor is mounted on the substrate table and the grid plate is mounted on a frame of said lithographic apparatus.

With this it is known to mount four sensors at the substrate table. It is desirable to position the sensors outside of a substrate held on the substrate table. Because of the range, the sensors are typically positioned at the corners of the substrate table. At the corners, however, the distance to the center of the substrate table and therefore also the weakness is the biggest. Furthermore the substrate table at the position of the sensors is even more weakened by removing material between the corners of the table in order to save mass.

However, if the corners of the substrate table deform by bending with respect to the x-y plane, this directly negatively influences the position measurement. The same goes for an expansion of the substrate table caused by temperature changes. This also negatively influences the position measurement.

SUMMARY

It is desirable to provide a high accuracy displacement measuring system for a lithographic apparatus which is configured to measure the position of a support structure constructed to support a patterning device or of a substrate table constructed to hold a substrate, with respect to a reference frame.

According to an embodiment of the invention, there is provided a lithographic apparatus including an illumination system configured to condition a radiation beam; a support structure constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a displacement measuring system to measure the position of a moveable object with respect to a reference frame of the lithographic apparatus, in at least three coplanar degrees of freedom (x, y, Rz) of an orthogonal x-y-z co-ordinate system centered in the center of the moveable object, the moveable object including one of the support structure and the substrate table, wherein the displacement measuring system includes at least three sensor heads, each sensor head being positioned with a measuring direction substantially coplanar with the x-y plane of the co-ordinate system and each sensor head being furthermore positioned with the measuring direction substantially perpendicular to a connection line connecting the sensor head with the center of the movable object and extending coplanar with the x-y plane.

According to an embodiment of the invention, there is provided a device manufacturing method including projecting a patterned beam of radiation onto a substrate, wherein the substrate is supported on a substrate table at least during projecting a patterned beam onto a target portion of the substrate, wherein the position of the substrate table with respect to a reference frame of the lithographic apparatus is measured by a displacement measuring system in at least three coplanar degrees of freedom (x, y, Rz) of an orthogonal x-y-z co-ordinate system centered in the center of the substrate table, wherein the displacement measuring system includes at least three sensor heads, each sensor head being positioned with a measuring direction substantially coplanar with the x-y plane of the co-ordinate system and each sensor head being furthermore positioned with the measuring direction substantially perpendicular to a connection line connecting the sensor head with the center of the movable object and extending coplanar with the x-y plane.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
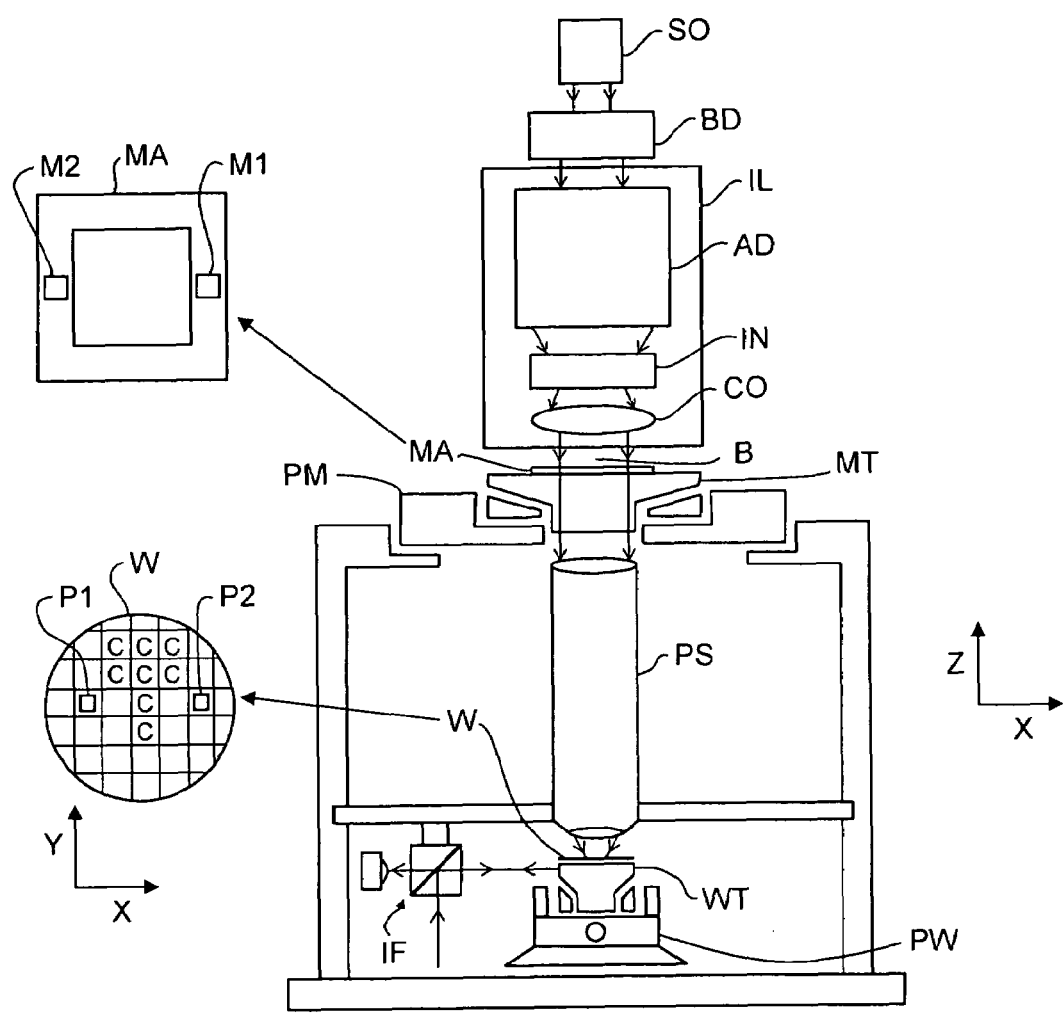
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate.

An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
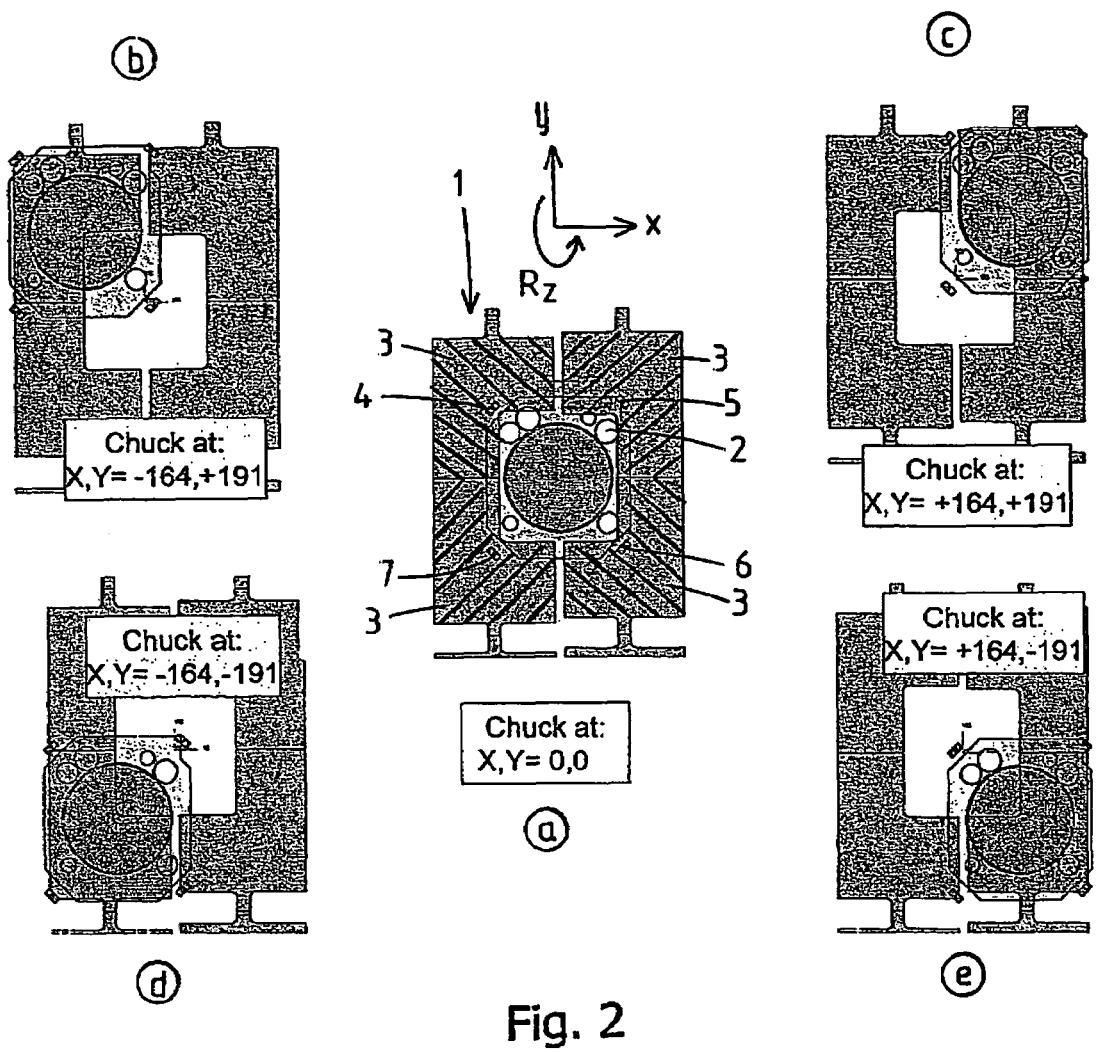
FIGS. 2a-e schematically show a displacement measuring system mounted on a substrate table and reference frame of a lithographic apparatus according to an embodiment of the present invention.
Figure 5:
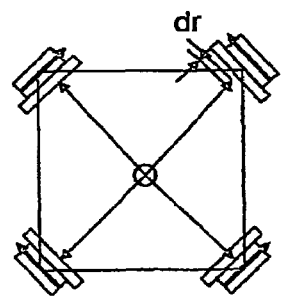
FIG. 5 shows another schematic view of FIG. 3 including an expansion in the radial direction.
Figure 3:
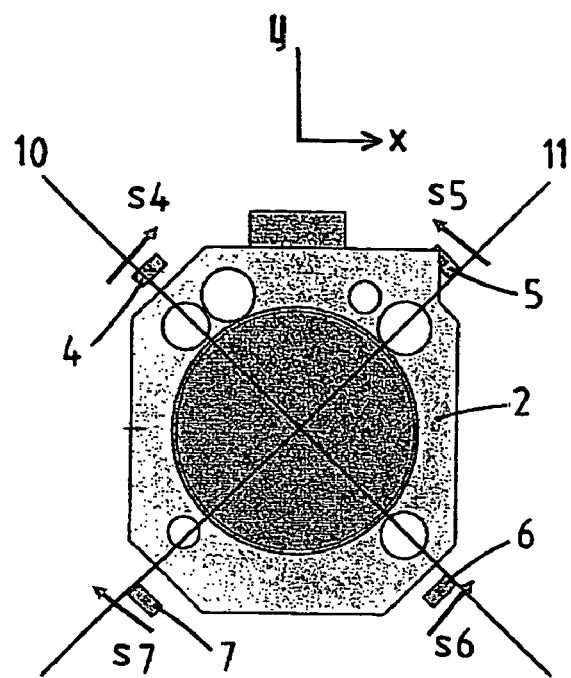
FIG. 3 shows an enlarged view of the substrate table of FIG. 2.
Figure 4:
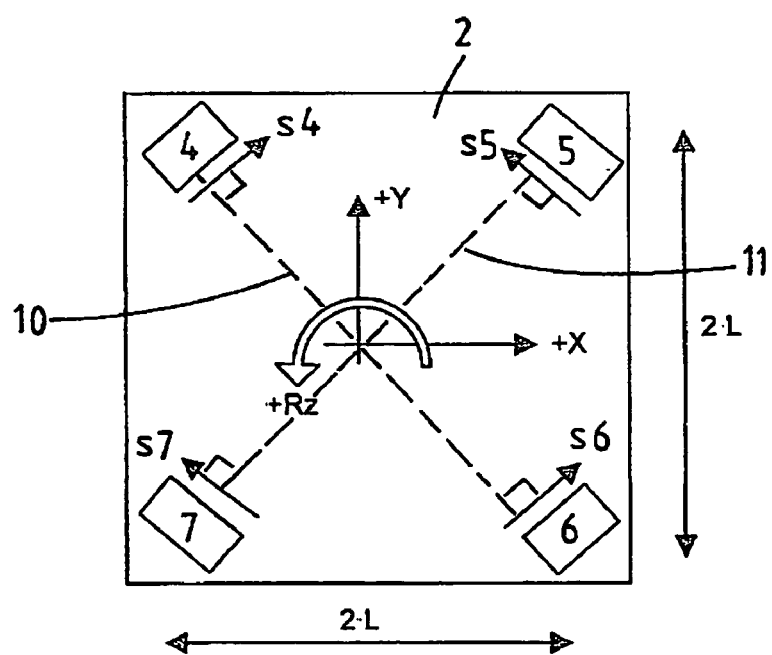
FIG. 4 shows a schematic view of FIG. 3.

FIG. 2a shows a first embodiment of a displacement measuring system 1 according to an embodiment of the invention. The displacement measuring system 1 is designed to measure the position of a substrate table 2 in at least three coplanar degrees of freedom, namely the x-position, the y-position, and the rotation about the z-axis Rz (the z-axis is the axis perpendicular to the x and y axis shown in the drawing). See also FIG. 3 in which the substrate table 2 is separately shown, and FIG. 4 in which the substrate table 2 is schematically shown together with the degrees of freedom.

The displacement measuring system 1 includes four adjacent grating plates 3 which are mounted on the lithographic apparatus, for instance on a frame such as the so-called metrology frame or on the lens. The grating plates 3 are substantially flat plates which are arranged in substantially the same plane which extends in the directions of the x-axis and the y-axis. The four grating plates 3 are adjacent, meaning that at least one side of each grating plate 3 is placed against or side by side with another grating plate 3. Together, the four grating plates 3 cover substantially all desired locations of the substrate table 2, so that the measuring system 1 is continuously capable of measuring the position of the substrate table 2.

In the present embodiment, the substrate table 2 is arranged under the grating plates 3. On the substrate table 2 four sensor heads 4, 5, 6, 7 are arranged. Each sensor head 4, 5, 6, 7 has a measuring direction s4, s5, s6, s7 respectively (see FIG. 3). These measuring directions s4, s5, s6, s7 lie substantially coplanar with the x-y plane. Furthermore, these measuring directions s4, s5, s6, s7 are substantially perpendicular to imaginary connection lines 10,11, which connect the respective sensor heads 4, 5, 6, 7 with the mass center and/or thermal center (x,y=0,0) of the substrate table 2 ("radially" extending connection lines). With "substantially coplanar" and "substantially perpendicular" is meant including a deviation of about +/−10 degrees, in particular a deviation of about +/−5 degrees. In the embodiment shown, these connection lines 10,11 enclose an angle of substantially +/−45 degrees with the x-y directions. Thus the four sensor heads are substantially equally divided around the center of the substrate table 2.

The sensor heads 4, 5, 6, 7 are of the encoder type which can determine the position of the respective sensor head with respect to a set of grating lines 14, which is arranged on the grating plates 3. With this, the grating lines 14 on a particular grating plate 3 are positioned substantially parallel to the corresponding connection line 10, 11 of the corresponding sensor 4, 5, 6 or 7 to be working together with this particular grating plate 3.

Figure 7:
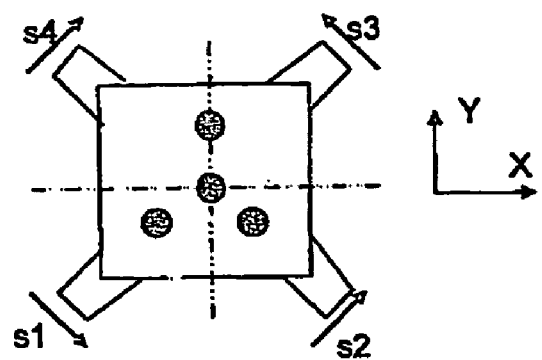
FIG. 7 shows a substrate table in accordance with an embodiment of the invention.

This "tangential" positioning of the sensor heads 4, 5, 6, 7 makes the displacement measuring system 1 insensitive for homogeneous expansion of the substrate table 2 with respect to its center, because the sensor heads 4, 5, 6, 7 move parallel to the grating lines 14 and thus do not detect any change. Thanks to this beneficial positioning, the sensor heads 4, 5, 6, 7 are insensitive for displacements in the radial directions. If in practice a small angle offset (tolerance and/or design) is present, the effect shall is minimized. Since the measurement direction s4, s5, s6, s7, s8 is at 45 degrees with respect to the main movement axes x and y, lots of signal periods come by to compensate for non-linearity. Since the substrate table 2 in its center (0,0) is independent for both (uniform) expansion of the substrate table 2 as well as of the grating plates 3, only one scan is required to calibrate and compensate for scaling (assuming uniform expansion of the chuck). Furthermore, there is a reduced sensitivity in the horizontal measurement direction for deformations of the substrate table 2 in the z-direction and bending out of horizontal plane, in particular if the sensors are mounted on radially extending arms of the substrate table (see FIG. 7) in order to save mass, which arms bend more easily upwards or downwards in the case of accelerations of the substrate table in the z-direction.

Each of the sensors may for instance be designed as described in the US application US 2004/0263846 A1, which document is hereby incorporated herein by reference.

Figure 6:
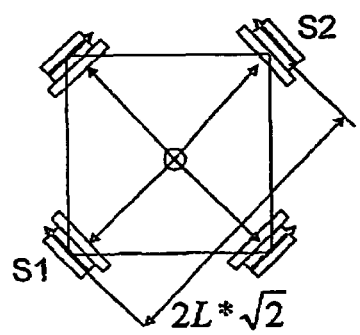
FIG. 6 shows the view of FIG. 5 including the distance between two diametrically opposed sensor heads.

It is possible to deduct the position of the substrate table 2 in the x- and y-direction with measurements with only three of the four sensor heads 4, 5, 6, 7. It is also possible to use all four sensor heads. The signals of one pair of the sensor heads may be used to determine the rotation Rz about the z-axis (rotation in the x-y plane). With this, for the determination of Rz a larger distance between the sensor heads (the distance being 2L*√2 as can be seen in FIG. 6) is available compared to an orthogonal positioning of the sensor heads according to the state of the art (where the distance is 2L), thus making the determination of Rz more accurate. FIGS. 2b-e show the four extreme positions of the substrate table 2 with respect to the grating plates 3, in which each time one of the sensor heads 4, 5, 6, 7 is not positioned underneath a grating plate 3, and thus can not participate in the measurement. Since it is possible to determine the position of the substrate table 2 with only three of the sensors 4, 5, 6, 7, it is possible to determine the three coplanar degrees of freedom (x, y, Rz) in all possible locations of the substrate table 2, that is to say also in the extreme positions shown. As a consequence, continuous high accuracy measurement (nanometer or sub-nanometer resolution) of the substrate table 2 is possible.

In the present embodiment four grating plates 3 are used as the physical dimensions of the grating plates 3 is limited. It may be practically difficult or at least expensive to produce grating plates of the size of the working area having a grating with the resolution to obtain the accuracy needed for embodiments of the present application. As the working range used by the substrate table is substantially larger than the physical maximum size of such grating plate 3, the working area is subdivided in four areas, each sensor having its own grating plate 3 and each position having its own set of sensors.

As indicated above the grating plates 3 are arranged adjacent to each other. In this implementation, a sensor head takes over from one grating plate 3 to another grating plate 3. During such sensor head take-over, i.e. a sensor head first co-operating with a first grating plate 3 and thereafter with a second grating plate 3, another sensor head may provide a signal to make continuous measurement possible. When the first sensor head is in the range of the other grating plate 3, possibly after re-initialization, this sensor head may again provide a signal representative for the position of the substrate table.

Although the subdivision of the working area in four subareas each having its own grating plate 3 makes it possible to cover all desired locations of the substrate table 2 in a relative efficient way, the crossings between the grating plates 3 makes a continuous measuring of the position of the substrate table 2 with a single sensor head difficult. Also, the presence of a hole or opening (for instance opening 8 which can receive a part of the projection system in the center of the four grating plates 3), or a damaged area in the grating plate 3 may cause that a single sensor head on that location may not be capable of measuring the position of the substrate table 2 with respect to one of the grating plates 3.

As described above, three of the sensor heads 4, 5, 6, 7 make it possible to determine the position of the substrate table in three coplanar degrees of freedom. There is thus one redundant sensor head. This extra sensor head can be used in the case one of the other sensor heads cannot be used since it is outside the range of the grating plates 3. For instance, it is possible that one of the sensor heads is positioned directly under the crossing of one grating plate 3 to another grating plate 3. In such case the respective sensor head may not deliver a signal representative for the position of the substrate table 2. However, the other three sensor heads, can determine the position of the substrate table 2 in three coplanar degrees of freedom, thus maintaining continuous high accuracy displacement/position measurement. By selectively using the proper set of three sensors which can each properly determine a signal representative for the position in the x-direction and y-direction, continuous control is obtained. The selection of the respective sensors may be performed by a selection device. The selection/choice of the respective grating plate 3 can be dependent on the position of the substrate table 2, but also on the status of the individual sensors (valid or not). When all four sensors 4, 5, 6, 7 can deliver a signal, the redundant signal may for instance be used for calibration of the measuring system 1. In case three of the four sensor heads 4, 5, 6, 7 are used, each sensor head contributes to both the determination of the x and y position. This provides for a maximum 30% noise reduction with respect to the orthogonal positioning of the sensor heads according to the state of the art.

In an embodiment, the grating plates are substantially rectangular plates, which are placed against each other. The sides of these plates are oriented in the x-direction and the y-direction. It is therefore preferable that the sensor heads are spaced (in the x-y-plane) with respect to each other in the x-direction and the y-direction. In other words, the arrangement of the sensor heads is such that none of the four sensor heads is arranged on the same line in the x-direction and none of the four sensor heads is arranged on the same line in the y-direction. In the embodiment shown in FIG. 8, this staggered positioning of the sensors is shown for the y-direction.

In an alternative embodiment, it is possible that the sides of the grating plates which are positioned against each other are not arranged in the x-direction and y-direction, but in one or more other directions in the x-y plane. These other directions are herein defined as the grating plate crossing line directions. In such case it is preferred that the sensor heads are spaced with respect to each other in one or more of these crossing line directions.

Further, it is remarked that it may be possible that in certain positions within the working range of the substrate table 2 more than one of the sensor heads are at the same time not capable of determining the position of the respective sensor head with respect to one of the grating plates 3. Such situation is undesirable, as this would result in only two sensors being capable of determining the position of the substrate table 2. As a consequence the position of the substrate table 2 cannot anymore be derived in two degrees of freedom.

The above undesired situation may be avoided by providing more redundant sensor heads which are located on different positions of the substrate table 2. Another solution for this situation is to limit the movements of the substrate table in such a way that, in the present embodiment, the substrate table 2 may only cross one crossing line direction at a single time, or that at least it may not be brought in positions of which it is known that the above situation will occur. The latter solution is generally preferred, as the provision of more sensor heads will increase costs and the weight of the substrate table 2.

In both solutions, it is therefore guaranteed that the measuring system will be able to determine the position of the substrate table 2 in all possible locations of the substrate table 2 during use of the lithographic apparatus. These locations include for instance a range for exposures, a range to move to and from the exposure range, a range for exchanging the substrates and a range for miscellaneous functions, alignment and such.

Furthermore, each substrate table preferably include at least three, in particular four, z-sensors to determine the position of the substrate table in the z-direction. With the signals of three of these four z-sensors three further degrees of freedom may be determined, namely the z-position, the rotation about the x-axis (Rz), and the rotation about the y-axis (Ry). The z-sensors are preferably interferometers but may be of any suitable type as discussed hereinafter.

Figure 8:
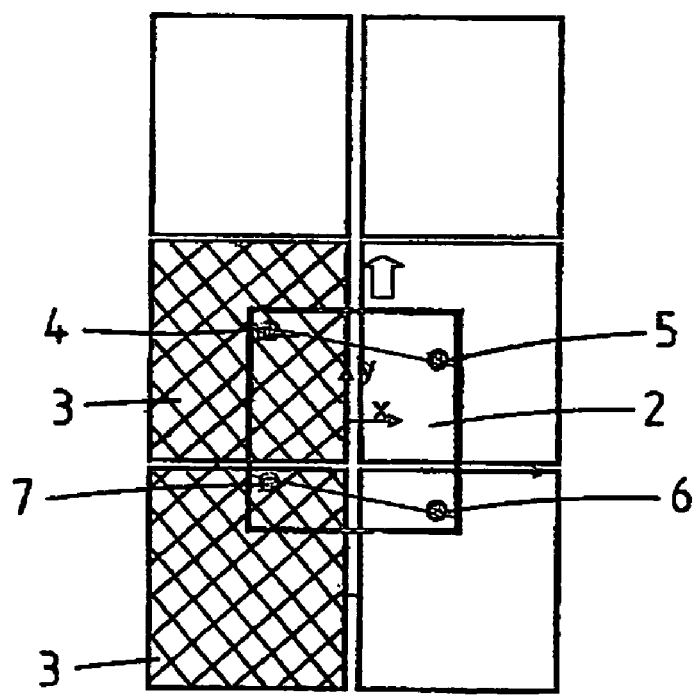
FIG. 8 shows schematic view of a variant embodiment of the displacement measuring system of FIG. 2.

The grating plates 3 may include a grid with not only the first set of grating lines, but also a second set of mutually parallel grating lines, extending substantially perpendicular to the first set. Thus at least one set of the grating lines is matched with the main measuring direction of the sensor head. The grating plates 3 may also be provided with a checkerboard pattern. In that case, the transitions between the light and the dark areas of the checkerboard pattern take over the role of the parallel lines of the grating. As shown in FIG. 8, this makes it possible for the respective sensor heads 4, 5, 6, 7 to cooperate with more than one grating plate 3, for example if the substrate table 2 is to be moved over a distance larger than the length of a grating plate 3. Thus at least two sensor heads share a grating plate, which is suitable for measurements in two directions.

Above a measuring system for the determination of the position of a substrate table has been described. Such a measuring system may however be used for any other movable object of which the position is to be determined on a high accuracy level. In this respect the measuring system may successfully be used for the determination of the position of a patterning device support structure in a lithographic apparatus. In particular, the system may be used to determine the position of a patterning device support structure on a high accuracy level in six degrees of freedom. All features of the measuring system described above may also be applied in a measuring system for other movable objects, such as the patterning device support structure.

Besides the embodiments shown many variants are possible. For example it is also possible to use three sensor heads, which preferably are divided at angles of substantially 120 degrees with respect to each other. Also it is possible to use more than four sensor heads. Instead of encoders operating together with grating plates, other types of sensor heads may be used, for example optical sensor heads, whether interferometric or triangulated, or capacitive sensor heads. Instead of using one-dimensional sensor heads having only one sensitive direction in the x-y plane, it is also possible to use a sensor head including two sensors with sensitive directions which are positioned obliquely upwardly, such that the tangential measuring direction in the x-y plane according to the invention can be computed, and that at the same time a measuring direction in the z-direction can be computed. In another variant the sensor heads may be mounted on the reference frame. The grating lines may be positioned with a slight offset with respect to the connecting lines, in order to provide for non-linearity corrections. Instead of the center of the moveable object being the mass center and/or the thermal center thereof, the center may for example also be substantially the crossing point through which the main weakest directions of the moveable object extend, for example weakest with respect to the bending resistance.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV)

radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a support structure constructed to support a patterning device, the patterning device being capable of imparting a radiation beam with a pattern in the cross-section of the radiation beam to form a patterned radiation beam;
   a substrate table constructed to hold a substrate;
   a projection system configured to project the patterned radiation beam onto a target portion of the substrate; and
   a displacement measuring system configured to measure a position of a moveable object with respect to a reference frame of said lithographic apparatus, in at least three coplanar degrees of freedom (x, y, Rz) of an orthogonal x-y-z coordinate system centered on said moveable object, said moveable object comprising one of said support structure or said substrate table, said displacement measuring system comprising
   at least three sensor heads, each sensor head being positioned along a measuring direction associated with said sensor head that is substantially coplanar with an x-y plane of said coordinate system, said measuring direction associated with said sensor head being substantially perpendicular to a line connecting said sensor head to a center of said movable object and extending coplanar with said x-y plane,
   wherein the measuring direction of each of the at least three sensor heads defines a non-zero angle with the x and y axes of the x-y-z coordinate system.

2. A lithographic apparatus according to claim 1, wherein said displacement measuring system comprises at least four sensors heads.

3. A lithographic apparatus according to claim 2, wherein said displacement measuring system is configured to selectively use, depending on the position of said moveable object, three of said four sensor heads to determine the position of said moveable object in said at least three coplanar degrees of freedom (x, y, Rz).

4. A lithographic apparatus according to claim 2, wherein the line is oriented at about +/−45 degree with respect to the x-y directions of said x-y-z coordinate system.

5. A lithographic apparatus according to claim 1, wherein at least one of said sensor heads is an encoder mounted on one of said moveable object and said reference frame, said displacement measuring system further comprising at least one grating plate mounted on the other one of said moveable object and said reference frame, on which grating plate a measurement can be made in at least one direction.

6. A lithographic apparatus according to claim 5, wherein said grating plate is mounted on said reference frame and wherein said encoder is mounted on said movable object.

7. A lithographic apparatus according to claim 5, wherein said grating plate comprises a grid on which measurements can be made in several directions.

8. A lithographic apparatus according to claim 1, wherein said moveable object is said substrate table.

9. A lithographic apparatus according to claim 1, wherein said sensor heads are positioned around said center so as to be equally divided around said center of said moveable object.

10. A lithographic apparatus according to claim 1, wherein said sensor heads are substantially equidistant from each other.

11. A lithographic apparatus according to claim 1, wherein at least one of said sensor heads is staggered with respect to its neighbouring sensor heads at least in either the x-direction or the y-direction.

12. A lithographic apparatus according to claim 1, wherein said center of said moveable object substantially corresponds to a crossing point of weakest directions of the object.

13. A lithographic apparatus according to claim 1, wherein said center of said moveable object is a mass center of said object.

14. A lithographic apparatus according to claim 1, wherein said center of said moveable object is a thermal center of said object.

15. A lithographic apparatus according to claim 1, wherein said sensor head comprises two sensors with sensitive directions that are positioned obliquely upwardly, such that said measuring direction substantially coplanar with said x-y plane can be computed, and that a measuring direction in the z-direction can be computed.

16. A lithographic apparatus according to claim 1, wherein said displacement measuring system is configured to measure the position of said moveable object in six degrees of freedom (x, y, z, Rx, Ry, Rz).

17. A device manufacturing method comprising:
    projecting a patterned beam of radiation onto a target portion of a substrate, said substrate supported on a substrate table during projection of a patterned beam of radiation; and
    measuring a position of the substrate table with respect to a reference frame of a lithographic apparatus with a displacement measuring system in at least three coplanar degrees of freedom (x, y, Rz) of an orthogonal x-y-z coordinate system centered on said substrate table, wherein said displacement measuring system comprises at least three sensor heads, each sensor head being positioned with a measuring direction associated with said sensor head that is substantially coplanar with an x-y plane of said coordinate system, said measuring direction associated with said sensor head substantially being perpendicular to a line connecting said sensor head with a center of said movable object and extending coplanar with said x-y plane,
    wherein the measuring direction of each of the at least three sensor heads defines a non-zero angle with the x and y axes of the x-y-z coordinate system.

18. A device manufactured using the apparatus according to claim 1.

* * * * *